(12) United States Patent
Yin et al.

(10) Patent No.: US 8,466,028 B2
(45) Date of Patent: Jun. 18, 2013

(54) METHOD FOR MANUFACTURING MULTIGATE DEVICE

(75) Inventors: Huaxiang Yin, Beijing (CN); Qiuxia Xu, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 41 days.

(21) Appl. No.: 13/322,473

(22) PCT Filed: Jul. 27, 2011

(86) PCT No.: PCT/CN2011/077667
§ 371 (c)(1),
(2), (4) Date: Nov. 25, 2011

(87) PCT Pub. No.: WO2013/000187
PCT Pub. Date: Jan. 3, 2013

(65) Prior Publication Data
US 2013/0005127 A1    Jan. 3, 2013

(30) Foreign Application Priority Data
Jun. 30, 2011   (CN) .......................... 2011 1 0182408

(51) Int. Cl.
*H01L 21/336* (2006.01)
(52) U.S. Cl.
USPC ........................................................ 438/283
(58) Field of Classification Search
USPC .............................................. 438/157, 283
See application file for complete search history.

(56) References Cited

U.S. PATENT DOCUMENTS

| | | | |
|---|---|---|---|
| 6,413,802 B1 | 7/2002 | Hu et al. | |
| 6,642,090 B1 | 11/2003 | Fried et al. | |
| 7,230,286 B2 * | 6/2007 | Cohen et al. | 257/210 |
| 7,449,373 B2 | 11/2008 | Doyle et al. | |
| 8,106,459 B2 | 1/2012 | Chang et al. | |
| 2007/0145431 A1* | 6/2007 | Kim et al. | 257/288 |
| 2009/0278196 A1 | 11/2009 | Chang | |

FOREIGN PATENT DOCUMENTS

| | | |
|---|---|---|
| CN | 101060136 A | 10/2007 |
| CN | 101577278 A | 11/2009 |

OTHER PUBLICATIONS

Int'l Search Report (Apr. 12, 2012).
Written Opinion (Apr. 12, 2012).

* cited by examiner

*Primary Examiner* — Bradley K Smith
(74) *Attorney, Agent, or Firm* — Goodwin Procter LLP

(57) ABSTRACT

A method for manufacturing a multigate device is provided, comprising: providing a semiconductor substrate; etching the semiconductor substrate to form a protruding fin; etching the semiconductor substrate at the bottom of the fin so as to form a gap between the fin and the semiconductor substrate; forming a dielectric layer which covers the semiconductor substrate and the fin and fills the gap; and etching the dielectric layer so as to expose the top and a portion of sidewalls of the fin. The present invention can realize isolation between fins with a simple process, which costs relatively low and is suitable for massive industrial application.

8 Claims, 6 Drawing Sheets

METHOD FOR MANUFACTURING MULTIGATE DEVICE

METHOD FOR MANUFACTURING MULTIGATE DEVICE

This application is a National Phase application of, and claims priority to, PCT Application No. PCT/CN2011/077667, filed on Jul. 27, 2011, entitled "METHOD FOR MANUFACTURING MULTIGATE DEVICE," which claimed priority to Chinese Patent Application No. 201110182408.1, filed on Jun. 30, 2011. Both the PCT application and Chinese application are incorporated herein by reference in their entireties.

FIELD OF THE INVENTION

The present invention relates to the field of semiconductor technologies, and in particular to a method for manufacturing a multigate device.

BACKGROUND OF THE INVENTION

As semiconductor technologies continuously advance, the gate-last technology has been widely used in the 45 nm process and the 32 nm process, to obtain a desirable threshold voltage and improve the device performance. However, when the Critical Dimension (CD) of devices is further scaled down, the conventional structure of MOS Field-Effect-Transistors can no longer provide satisfactory device performance even if the gate-last technology is employed. As an alternative of the conventional device, the multigate device has drawn a great deal of attention.

A Fin Field-Effect Transistor (FinFET) is a common multigate device. As shown in FIG. 1, a perspective view of the structure of a conventional FinFET, the FinFET comprises: a semiconductor substrate 10, with a fin 101 that protrudes from the semiconductor substrate 10, the fin 101 being generally obtained by etching the semiconductor substrate 10; a dielectric layer 11, covering the surface of the semiconductor substrate 10 and a portion of the sidewalls of the fin 101; and a gate structure 12, formed across the fin 101 and covering the top and the sidewalls of the fin 101, the gate structure 12 comprising a gate dielectric layer (not shown) and a gate electrode (not shown) on the gate dielectric layer. In the FinFET, the portions of the top and sidewalls of the fin 101 that are in contact with the gate structure 12 become the channel region, resulting in multiple gates, and facilitating the increase in drive current and improving device performance. In the prior art, the cross section of the gate structure 12 may have a number of shapes, e.g., Π shape, Ω shape, quadrilateral, or cylinder.

FIG. 2 to FIG. 6 illustrate a conventional method for manufacturing a multigate device.

As shown in FIG. 2, a semiconductor substrate 20 is provided, with a patterned hardmask layer 21 formed on it, the hardmask layer 21 being patterned to define the pattern of the fin. The semiconductor substrate 20 is generally a silicon substrate, and the hardmask layer 21 may be silicon nitride.

As shown in FIG. 3, the semiconductor substrate 20 is etched by using the patterned hardmask layer 21 as a mask, to form a protruding fin 201.

As shown in FIG. 4, a dielectric layer 22 is formed, covering the semiconductor substrate 20, the fin 201 and the patterned hardmask layer 21. The dielectric layer 22 is generally silicon oxide.

As shown in FIG. 5, the surface of the dielectric layer 22 is planarized by chemical mechanical polishing (CMP), and the surface of the dielectric layer 22 and the patterned hardmask layer are removed by etching, such that the top and a portion of the sidewalls of the fin 201 are exposed.

The remanent dielectric layer 22 on the semiconductor substrate 20 can isolate adjacent fins 201. However, the fins 201 are all connected to the semiconductor substrate 20 at their bottoms, causing leakage current between adjacent fins 20. Therefore, ion implantation is needed at the bottom of the fin 201, to form a doped junction for isolation. However, ion implantation based isolation is poor, and the implantation process is hard to control.

FIG. 6 illustrates another method for isolating the fins 201, in which selective lateral oxidation of the remanent dielectric layer 22 is performed, so that the dielectric layer 22 is laterally extended to isolate adjacent fins 201. However, this method has a relatively high processing complexity, requiring a high oxidation temperature, and introduces additional stress in the fin 201, which may affects the performance of the eventual device.

In addition, in the prior art, the fin may be formed on a Silicon-On-Insulator (SOI) substrate. Due to the buried oxide layer of the SOI that is beneath the fins, adjacent fins can be completely isolated. However, manufacturing cost of SOI substrates is relatively high.

For more information regarding the multigate device, please refer to U.S. Pat. No. 6,642,090 and No. 7,449,373.

SUMMARY OF THE INVENTION

A problem to be solved by the present invention is to provide a method for manufacturing a multigate device, which realizes isolation between fins in a bulk multigate device with a simple process.

To solve the problem above, the present invention provides a method for manufacturing a multigate device, comprising:
  providing a semiconductor substrate;
  etching the semiconductor substrate to form a protruding fin;
  etching the semiconductor substrate at the bottom of the fin so as to form a gap between the fin and the semiconductor substrate;
  forming a dielectric layer which covers the semiconductor substrate and the fin and fills the gap; and
  etching the dielectric layer so as to expose the top and a portion of sidewalls of the fin.

Optionally, the step of etching the semiconductor substrate at the bottom of the fin so as to form a gap between the fin and the semiconductor substrate may comprises:
  forming a spacer on the sidewalls of the fin; and
  etching the semiconductor substrate at the bottom of the fin by isotropic etching and using the spacer as a mask, so as to form a gap between the fin and the semiconductor substrate.

Optionally, the protruding fin may be formed by anisotropic etching, during which reaction a polymer is formed; and the step of etching the semiconductor substrate at the bottom of the fin so as to form a gap between the fin and the semiconductor substrate may comprise: etching the semiconductor substrate at the bottom of the fin by isotropic etching and using the polymer formed from the anisotropic etching as a mask, so as to form a gap between the fin and the semiconductor substrate.

Optionally, the anisotropic etching may use a gas comprising $Cl_2$, HBr, He and $O_2$, with $Cl_2$ having a flow rate ranging from 90 sccm to 110 sccm, and HBr having a flow rate ranging from 50 sccm to 70 sccm; and the etching may use a pressure ranging from 3 mtorr to 30 mtorr, a RF power ranging from 300 W to 600 W, and a bias power ranging from 50 W to 100 W.

Optionally, the isotropic etching may use a gas comprising $Cl_2$, HBr, He and $O_2$, with $Cl_2$ having a flow rate ranging from 15 sccm to 25 sccm, and HBr having a flow rate ranging from 0.5 sccm to 2 sccm; and the etching may use a pressure ranging from 50 mtorr to 100 mtorr, a RF power ranging from 800 W to 1500 W, and a bias power ranging from 60 W to 120 W.

Optionally, the semiconductor substrate may be a material selected from a group consisting of: monocrystalline, multi-layer quantum well, two-dimensional graphene, polycrystalline and amorphous structures of silicon, germanium, strained silicon, strained germanium, GaAs, InP, InGaAs, AlGaAs, InAlAs, InAs, AlSb, InSb, AlInSb, GaN and AlGaN.

Optionally, the dielectric layer may be formed by conformal deposition.

Optionally, the dielectric layer may be one of a low-temperature oxide layer, borophosphosilicate glass, silicon nitride and a low dielectric constant (low-K) dielectric.

Optionally, before the etching the dielectric layer, the method for manufacturing a multigate device may further comprise: planarizing a surface of the dielectric layer.

Optionally, after the etching the dielectric layer, the method for manufacturing a multigate device may further comprise: forming a gate dielectric layer and then a gate electrode layer, such that the gate dielectric layer covers the top and the sidewalk of the fin on the dielectric, and the gate electrode layer covers the gate dielectric layer.

Compared with the prior art, the embodiments of the present invention have the following advantages.

In the method for manufacturing a multigate device according to the embodiments of the present invention, when a fin has been formed, the semiconductor substrate at the bottom of the fin is etched so as to form a hollow gap between the fin and the semiconductor substrate; then a dielectric layer is formed, covering the semiconductor substrate and the fin and filling the gap therebetween; then the dielectric layer is etched so as to expose the top and a portion of sidewalls of the fin, and the remenant the dielectric layer isolates the fins completely. The method of the embodiments of the present invention has a relatively low processing complexity and a relatively low cost, and hence is suitable for massive industrial application.

Furthermore, according to the embodiments of the present invention, a spacer is formed on the sidewalls of the fin, and then the semiconductor substrate at the bottom of the fin is etched by using the spacer as a protective layer, to form the gap, thereby avoiding damages by the etching process to the small-sized fin.

BRIEF DESCRIPTION OF THE DRAWINGS

The above and other objects, features and advantages of the present invention will become more apparent when read in conjunction with the accompanying drawings, in which like reference numerals denote like elements. The figures are not drawn to scale, in order to not unnecessarily obscure the present invention.

DETAILED DESCRIPTION OF THE INVENTION

A conventional method for manufacturing a multigate device normally uses ion implantation, lateral selective oxidation or SOI substrates to realize isolation between fins. But these methods or processes have a relatively high complexity or a high cost, not suitable for massive industrial application.

In a method for manufacturing a multigate device according to an embodiment of the present invention, when a fin has been formed, the semiconductor substrate at the bottom of the fin is etched so as to form a hollow gap between the fin and the semiconductor substrate; then a dielectric layer is formed, covering the semiconductor substrate and the fin and filling the gap therebetween; then the dielectric layer is etched so as to expose the top and a portion of sidewalls of the fin, and the remnant the dielectric layer isolates the fins completely. The method of the embodiments of the present invention has a relatively low processing complexity and a relatively low cost, and hence is suitable for massive industrial application.

Furthermore, according to the embodiments of the present invention, a spacer is formed on the sidewalls of the fin, and then the semiconductor substrate at the bottom of the fin is etched by using the spacer as a protective layer, to form the gap, thereby avoiding damages by the etching process to the small-sized fin.

For a better understanding of the objects, features and advantages above of the present invention, the embodiments of the present invention will be described in details hereinafter with reference to the accompanying drawings.

In the following description, numerous specific details are set forth, in order to provide a thorough understanding of the present invention. It will be apparent to one skilled in the art, that the present invention may be practiced without these specific details, and that equivalents to the present invention may be obtained without deviation from the essence of the present invention. Hence the present invention is not limited to the embodiments disclosed herein.

Figure 1:
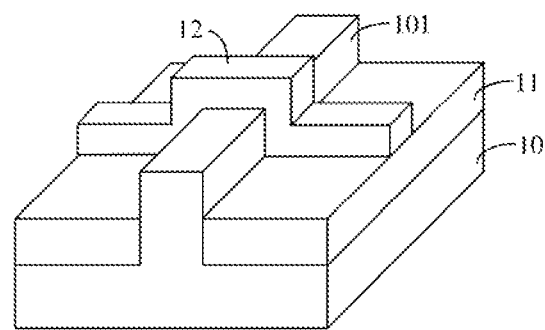
FIG. 1 is a perspective view of the structure of a conventional FinFET.
Figure 2:
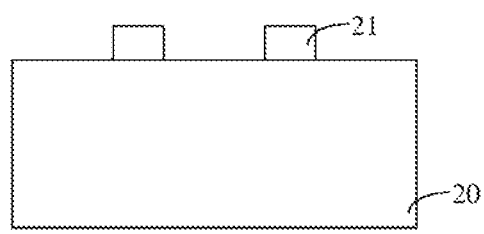
FIG. 2 to FIG. 6 illustrate respective steps of a conventional method for manufacturing a multigate device in the prior art with a cross sectional view.
Figure 3:
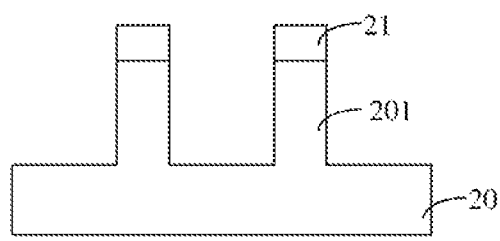
Figure 4:
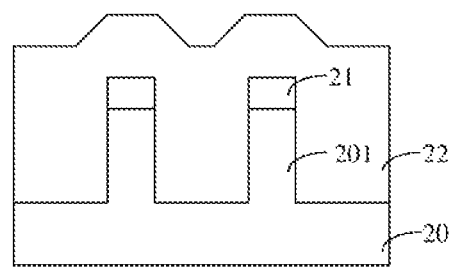
Figure 5:
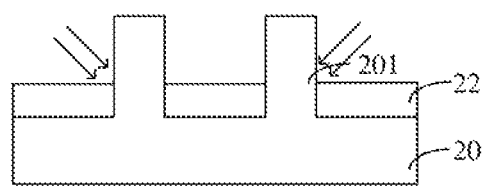
Figure 6:
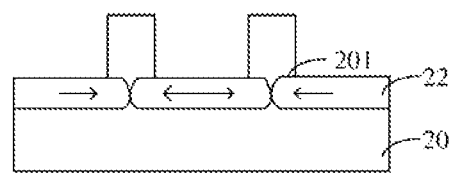
Figure 7:
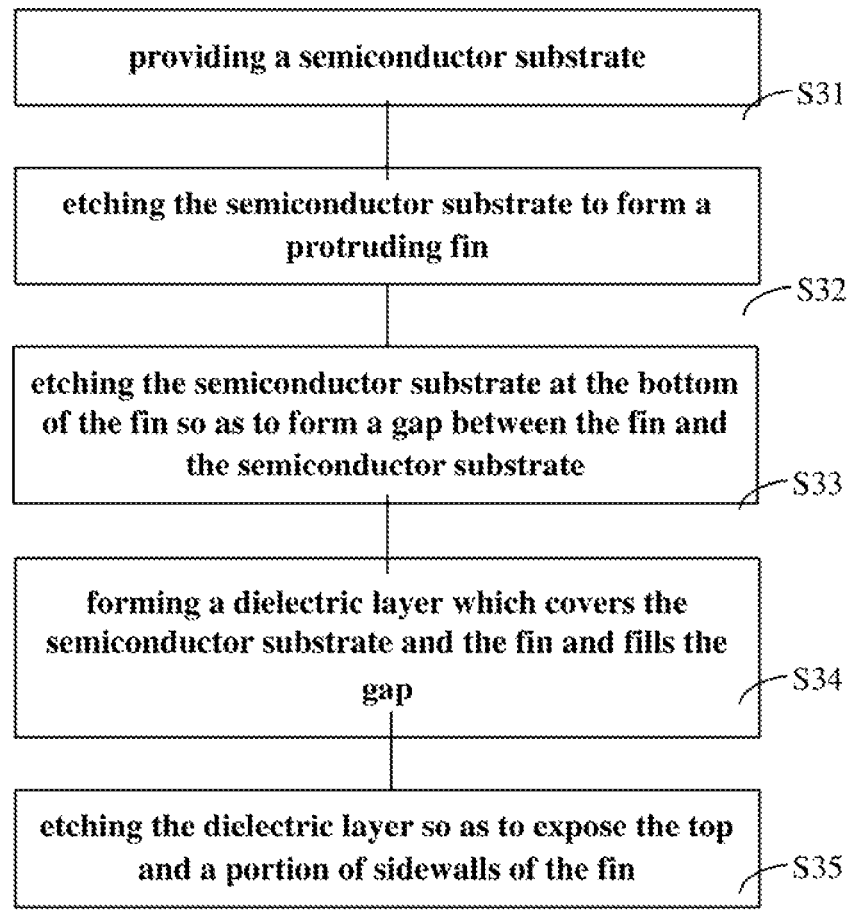
FIG. 7 is a flow chart of a method for manufacturing a multigate device according to an embodiment of the present invention.

As shown in FIG. 7, a flow chart of a method for manufacturing a multigate device according to an embodiment of the present invention, the method comprises:

step S31, providing a semiconductor substrate;

step S32, etching the semiconductor substrate to form a protruding fin;

step S33, etching the semiconductor substrate at the bottom of the fin so as to form a gap between the fin and the semiconductor substrate;

step S34, forming a dielectric layer which covers the semiconductor substrate and the fin and fills the gap; and step S35, etching the dielectric layer so as to expose the top and a portion of sidewalls of the fin.

FIG. 8 to FIG. 15 illustrate respective steps of a method for manufacturing a multigate device according to an embodiment of the present invention with a cross sectional view. The embodiment is described below with reference to FIG. 7 and FIGS. 8 to 15.

Figure 8:
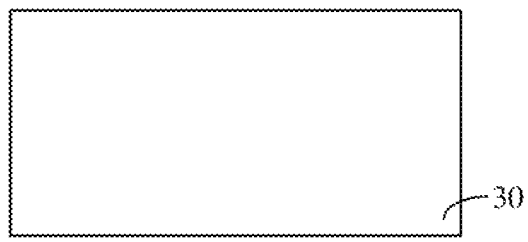
FIG. 8 to FIG. 15 illustrate respective steps of a method for manufacturing a multigate device according to an embodiment of the present invention with a cross sectional view.

As shown in FIG. 7 and FIG. 8, step S31 is performed: providing a semiconductor substrate 30. The semiconductor substrate may be a material selected from a group consisting of: monocrystalline, multi-layer quantum well, two-dimensional graphene, polycrystalline and amorphous structures of silicon, germanium, strained silicon, strained germanium, GaAs, InP, in GaAs, AlGaAs, InAlAs, InAs, AlSb, InSb, AlInSb, GaN and AlGaN. In this embodiment, the semiconductor substrate 30 may be silicon substrate, i.e., a bulk-silicon substrate.

Figure 9:
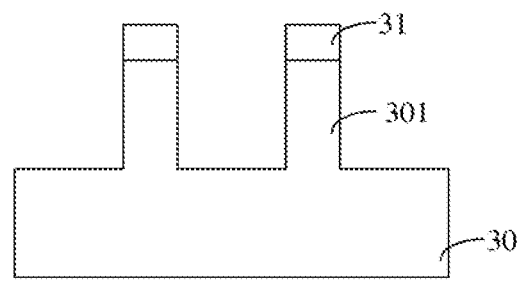

As shown in FIG. 7 and FIG. 9, step S32 is performed: etching the semiconductor substrate 30 to form a protruding fin 301. Specifically, the forming of the fin 301 may comprise: forming a hardmask layer 31 on the semiconductor substrate 30 and patterning it so as to define the pattern of the fin 301; etching the semiconductor substrate 30 by using the patterned hardmask layer 31 as a mask, to form one or more protruding fins 301. As an example, the number of fins 301 is two in FIG. 9. It is noted that the number of fins 301 can be arbitrary, e.g., three or five, depending on actual needs. As an example, the patterned hardmask layer 31 covering the fins 301 is included in FIG. 9.

Figure 12:
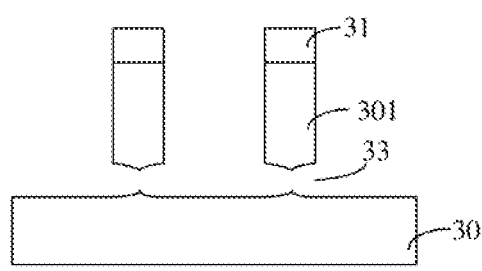

As shown in FIG. 7 and FIG. 12, step S33 is performed: etching the semiconductor substrate 30 at the bottom of the fin 301 so as to form a gap 33 between the fin 301 and the semiconductor substrate 30.

Figure 10:
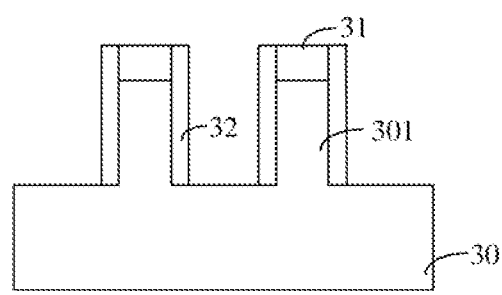

Specifically, firstly, as shown in FIG. 10, a spacer 32 is formed on the sidewalls of the fin 301, and in this embodiment the spacer 32 may be silicon oxide. The forming of the spacer 32 may comprise: forming an oxide layer, which covers the semiconductor substrate 30, the sidewalls of the fin 301 and the patterned hardmask layer 31; and anisotropically etching the oxide layer, to remove the oxide layer on the surface of the semiconductor substrate 30 and the patterned hardmask layer 31. The oxide layer left on the sidewalls of the fin 301 is the spacer 32.

Figure 11:
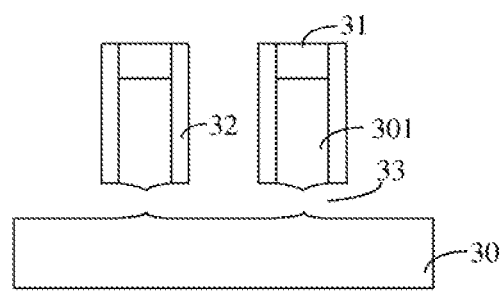

Then, as shown in FIG. 11, the semiconductor substrate 30 at the bottom of the fin 301 is isotropically etched by using the spacer 32 as a mask, so as to form the gap 33 between the fin 301 and the semiconductor substrate 30. In this embodiment, the isotropic etching may use a gas comprising $Cl_2$, HBr, He and $O_2$, with $Cl_2$ having a flow rate ranging from 15 sccm to 25 sccm, and HBr having a flow rate ranging from 0.5 sccm to 2 sccm; and the etching may use a pressure ranging from 50 mtorr to 100 mtorr, a RF power ranging from 800 W to 1500 W, and a bias power ranging from 60 W to 120 W. The spacer 32 formed on the sidewalls of the fin 301 protects the fin 301 during the isotropic etching and prevents it from damages during the etching.

Next, as shown in FIG. 12, the spacer on the sidewalls of the fin 301 is removed. It is noted, FIG. 12 is a cross sectional view, and although the gap 33 shown in FIG. 12 looks separating the fin 301 from the semiconductor substrate 30, actually, the lower end of the fin 301 along the direction perpendicular to the page is not etched, and remains connected with the semiconductor substrate 30, as a support of the whole fin 301.

In this embodiment, the spacer is used to protect the fin 301, and prevent the fin from damages during the forming of the gap 33 by etching. In other embodiments, the fin 301 may be formed by anisotropic etching, and a polymer produced during the anisotropic etching may be left on the sidewalls of the fin 301. The polymer may be used to protect the fin 301 in the subsequent step of forming the gap 33 by isotropic etching. Specifically, the processing parameters for the anisotropic etching for forming the fin 301 may comprise: $Cl_2$, HBr, He and $O_2$, with $Cl_2$ having a flow rate ranging from 90 sccm to 110 sccm, and HBr having a flow rate ranging from 50 sccm to 70 sccm; and the etching may use a pressure ranging from 3 mtorr to 30 mtorr, a RF power ranging from 300 W to 600 W, and a bias power ranging from 50 W to 100 W. The subsequent step of forming the gap 33 by isotropic etching may still use the parameters in the embodiment above.

Figure 13:
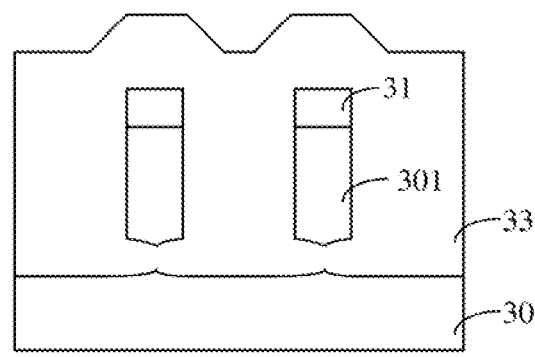

As shown in FIG. 7 and FIG. 13, step S34 is performed: forming a dielectric layer 33 which covers the semiconductor substrate 30 and the fin 301 and fills the gap. The dielectric layer 33 may be formed by conformal deposition. The dielectric layer 33 may be a low-temperature oxide layer, borophosphosilicate glass, silicon nitride or a low dielectric constant (low-K) dielectric. The low-K dielectric may be, e.g., silicon oxy-fluorine, silicon oxy-carbide, porous silicon oxide, spin-coated organic polymer insulating material, spin-coated organic silicone polymer insulating material, air, or any other silicon oxide based material with a low viscosity coefficient. In this embodiment, the dielectric layer 33 may be a low-temperature oxide layer.

Figure 15:
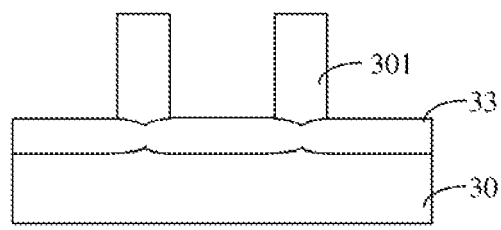

As shown in FIG. 7 and FIG. 15, step S35 is performed: etching the dielectric layer 33 so as to expose the top and a portion of sidewalls of the fin 301.

Figure 14:
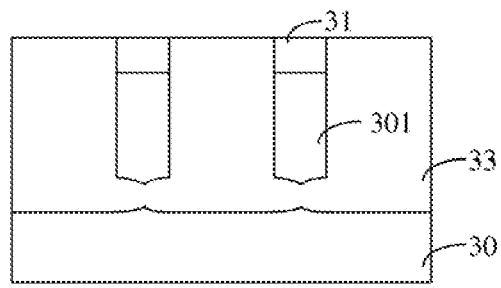

Specifically, as shown in FIG. 14, firstly, the surface of the dielectric layer 33 is planarized, such that the patterned hardmask layer 31 is exposed. The planarization may be performed with chemical mechanical polishing (CMP), anisotropic etching, or the like.

Then, as shown in FIG. 15, it is continued to etch the dielectric layer 33, until the thickness of the remanent dielectric layer 33 falls within a predetermined thickness range, and the patterned hardmask layer at the top of the fin 301 is removed. The remanent dielectric layer 33 passes through the fin 301 and the semiconductor substrate 30, so that adjacent fins 301 are completely isolated from each other. The isolation according to the embodiment is generally realized by forming a hollow gap by etching, and filling the gap to form a dielectric layer. This method has a relatively low processing complexity and a relatively low cost, and hence is suitable for massive industrial application. In this embodiment, the patterned hardmask layer 31 is also removed by the etching while the etching of the dielectric layer 33 continues.

Then, similarly to a conventional FinFET or another type of multigate device, a gate dielectric layer and a gate electrode layer may be formed, such that the gate dielectric layer covers the top and the sidewalls of the fin 301 on the dielectric layer, and the gate electrode layer covers the gate dielectric layer.

Preferred embodiments of the invention are disclosed above, which should not be interpreted as limiting the scope of the invention. Alternations and modifications can be made to the technical solution of the invention by those skilled in the art based on the technical disclosure herein without deviation from the scope of the invention. Therefore, any alternations, equivalents, or modifications made to the embodiments disclosed herein based on the technical essential of the invention without deviation from the scope of the invention should fall within the scope of the invention.

The invention claimed is:

1. A method for manufacturing a multigate device, comprising:
   providing a semiconductor substrate;
   etching the semiconductor substrate to form a protruding fin;
   etching the semiconductor substrate at the bottom of the fin so as to form a gap between the fin and the semiconductor substrate;
   forming a dielectric layer which covers the semiconductor substrate and the fin and fills the gap; and
   etching the dielectric layer so as to expose the top and a portion of sidewalls of the fin;
   wherein, the protruding fin is formed by anisotropic etching, during which reaction a polymer is formed; and the step of etching the semiconductor substrate at the bottom of the fin so as to form a gap between the fin and the semiconductor substrate comprises: etching the semiconductor substrate at the bottom of the fin by isotropic etching and using the polymer formed from the anisotropic etching as a mask, so as to form a gap between the fin and the semiconductor substrate.

2. The method for forming a multigate device according to claim 1, wherein, the anisotropic etching uses a gas comprising $Cl_2$, HBr, He and $O_2$, with $Cl_2$ having a flow rate ranging from 90 sccm to 110 sccm, and HBr having a flow rate ranging from 50 sccm to 70 sccm; and the etching uses a pressure ranging from 3 mtorr to 30 mtorr, an RF power ranging from 300 W to 600 W, and a bias power ranging from 50 W to 100 W.

3. The method for forming a multigate device according to claim 1, wherein, the isotropic etching uses a gas comprising $Cl_2$, HBr, He and $O_2$, with $Cl_2$ having a flow rate ranging from 15 sccm to 25 sccm, and HBr having a flow rate ranging from 0.5 sccm to 2 sccm; and the etching uses a pressure ranging from 50 mtorr to 100 mtorr, an RF power ranging from 800 W to 1500 W, and a bias power ranging from 60 W to 120 W.

4. The method for forming a multigate device according to claim 1, wherein, the semiconductor substrate is a material selected from a group consisting of: monocrystalline, multilayer quantum well, two-dimensional graphene, polycrystalline and amorphous structures of silicon, germanium, strained silicon, strained germanium, GaAs, InP, InGaAs, AlGaAs, InAlAs, InAs, AlSb, InSb, AlInSb, GaN and AlGaN.

5. The method for forming a multigate device according to claim 1, wherein, the dielectric layer is formed by conformal deposition.

6. The method for forming a multigate device according to claim 1, wherein, the dielectric layer is one of a low-temperature oxide layer, borophosphosilicate glass, silicon nitride and a low dielectric constant (low-K) dielectric.

7. The method for forming a multigate device according to claim 1, wherein, before the etching the dielectric layer, the method further comprises: planarizing a surface of the dielectric layer.

8. The method for forming a multigate device according to claim 1, wherein, after the etching the dielectric layer, the method further comprises: forming a gate dielectric layer and then a gate electrode layer, such that the gate dielectric layer covers the top and the sidewalls of the fin on the dielectric, and the gate electrode layer covers the gate dielectric layer.

* * * * *